United States Patent
Cheng

(10) Patent No.: US 6,860,323 B2
(45) Date of Patent: Mar. 1, 2005

(54) RADIATOR FAN

(75) Inventor: Jui-Hung Cheng, Kaohsiung (TW)

(73) Assignee: Asia Vital Components Co., Ltd. (TW)

( * ) Notice: Subject to any disclaimer, the term of this patent is extended or adjusted under 35 U.S.C. 154(b) by 0 days.

(21) Appl. No.: 10/382,218

(22) Filed: Mar. 5, 2003

(65) Prior Publication Data

US 2004/0173339 A1 Sep. 9, 2004

(51) Int. Cl.$^7$ .............................................. H05K 7/20
(52) U.S. Cl. ...................................... 165/121; 361/697
(58) Field of Search ............................... 165/80.3, 121, 165/185; 361/697, 704, 710; 257/719, 722; 174/16.3

(56) References Cited

U.S. PATENT DOCUMENTS

| | | | | |
|---|---|---|---|---|
| 5,638,895 A | * | 6/1997 | Dodson ........................ | 165/121 |
| 5,724,228 A | * | 3/1998 | Lee .............................. | 361/697 |
| 6,160,704 A | * | 12/2000 | Rusate ......................... | 361/697 |
| 6,311,766 B1 | * | 11/2001 | Lin et al. ..................... | 165/80.3 |
| 6,341,644 B1 | * | 1/2002 | Lo et al. ...................... | 165/80.3 |
| 6,392,885 B1 | * | 5/2002 | Lee et al. .................... | 361/697 |
| 6,401,807 B1 | * | 6/2002 | Wyler et al. ................. | 165/121 |
| 6,434,002 B1 | * | 8/2002 | Wei .............................. | 361/697 |
| 6,466,443 B1 | * | 10/2002 | Chen ........................... | 361/695 |
| 6,480,383 B2 | * | 11/2002 | Kodaira et al. .............. | 361/697 |
| 6,525,941 B1 | * | 2/2003 | Lai .............................. | 361/697 |
| 6,560,111 B1 | * | 5/2003 | Lo ............................... | 361/719 |
| 6,672,374 B1 | * | 1/2004 | Lin ............................. | 165/121 |
| 2002/0011326 A1 | * | 1/2002 | Matsumoto ................. | 165/80.3 |
| 2003/0142478 A1 | * | 7/2003 | Huang et al. ................ | 361/704 |

FOREIGN PATENT DOCUMENTS

JP       200294272 A1 * 3/2002  ............ H05K/7/20

* cited by examiner

*Primary Examiner*—Allen J. Flanigan

(57) ABSTRACT

A radiator fan includes a hollow fixing plate and support frames extending upward from the fixing plate to be joined to a guard plate. A fan assembly is arranged under the guard plate and at least a wind shielding plate and at least an air inlet are disposed between the support frames alternately so that it is possible to increase the static pressure and the airflow with low noise level. In addition, the radiator fan further includes a radiator and a fan stand. The radiator is received in the base and the fan stand has inversed hooks to be attached to the radiator from top with the inversed hooks. The fan stand is provided with locating posts to fit with locating holes provided in the fan assembly. The product made can be standardized with excellent interchangeability.

5 Claims, 6 Drawing Sheets

RADIATOR FAN

BACKGROUND OF THE INVENTION

1. Field of the Invention

The present invention relates a radiator fan, more particularly, to a fan with radiator structure possible to increase static pressure and airflow and to lower noise level.

2. Description of Related Art

High performance and low noise level are goals pursued by manufacturers of radiator fans, which are used especially for central processing units (CPUs), and it is a trend that a product is designed with lightness, thinness, shortness and smallness. Therefore, the manufactures have kept endeavoring to make radiator fans that are highly compact and highly efficient with low noise level.

In order to remove heat generated by electronic components such as CPUs and chips, a conventional radiator fan shown in FIG. 1 provides a radiator 40 attached with a fan 20 and a base support 30 is joined to the radiator 40 so as to be fixed to a main board. However, the frame of the fan 20 is an integral piece and it is possible for the airflow to move downward from the top of the radiator fan only. Due to considering the compactness, the radiator fan is made with a very limited space for airflow and it results in low static pressure, low airflow and high noise level because of the air inlet being blocked.

Referring to FIG. 2, another conventional radiator fan provides a hollow fixing plate, which extends upward a plurality of support posts, and a guard plate is joined to upper ends of the support posts. A fan 20 is disposed under the guard plate with wind shielding plates extend between support posts. Two baffles extend between the support posts at two lateral sides thereof and an opening is formed between the two baffles. The fan 20 further is disposed over the radiator 40. When a base 30 is associated with the radiator 40 and the fan 20 can be attached to the radiator 40 with a retaining device. However, openings are easily blocked with the retaining devices such that the incoming airflow becomes less with low static pressure, low airflow and high noise level. Further, the retaining device is complicated in structure so that it is inconvenient during fixing the fan and the retaining device has a fixed specification with inferior interchangeability.

SUMMARY OF THE INVENTION

The crux of the invention is in that problems that reside in the radiator fans are solved by way of the professional knowledge of the present inventor in addition to numerous prototypes and tests and the invention that provided high static pressure, high airflow and low noise level is developed advantageously.

A main object of the present invention is to provide a radiator fan, which includes a hollow fixing plate and multiple support frames extending upward from the fixing plate and are joined to a guard plate. Besides, a fan assembly is arranged under the guard plate and wind shielding plates and air inlets are disposed respectively between the support frames alternately on the fixing plate. Further, a respective opening is formed between the guard plate and each wind shielding plate. Hence, the wind shielding plates and the air inlets are not blocked after the fan stand and the fan assembly being assembled together and the air inlets are big enough to prevent generation of turbulence and loud noise. In the mean time, the height of the fan stand with the fan assembly is low after being joined together so that a pressure difference can be produced at the air inlets to produce preferable static pressure and meet the requirements of high performance and low noise level.

Another object of the present invention is to provide a radiator fan a base, which includes a radiator, a fan stand, and a fan assembly. The radiator is received in the base. The fan stand has multiple inversed hooks and is attached to the radiator from top with the inversed hooks. Further, the fan stand is provided with multiple locating posts to fit with multiple locating holes provided in the fan assembly. Hence, the product can be standardized with excellent interchangeability.

BRIEF DESCRIPTION OF THE DRAWINGS

The present invention can be more fully understood by reference to the following detailed description and accompanying drawings, in which.

DETAILED DESCRIPTION OF PREFERRED EMBODIMENTS

Figure 1:
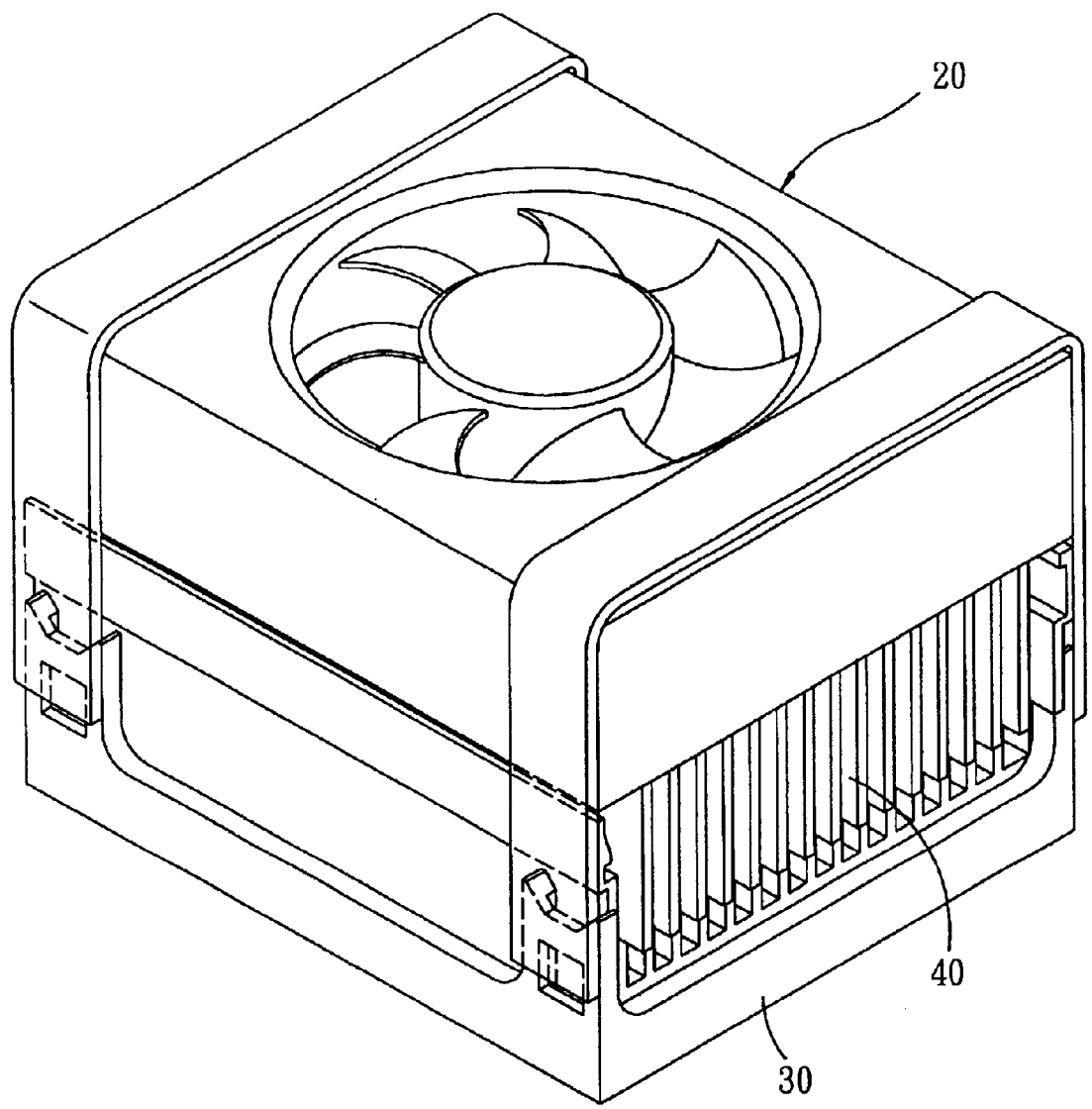
FIG. 1 is a perspective view of a conventional radiator fan.
Figure 2:
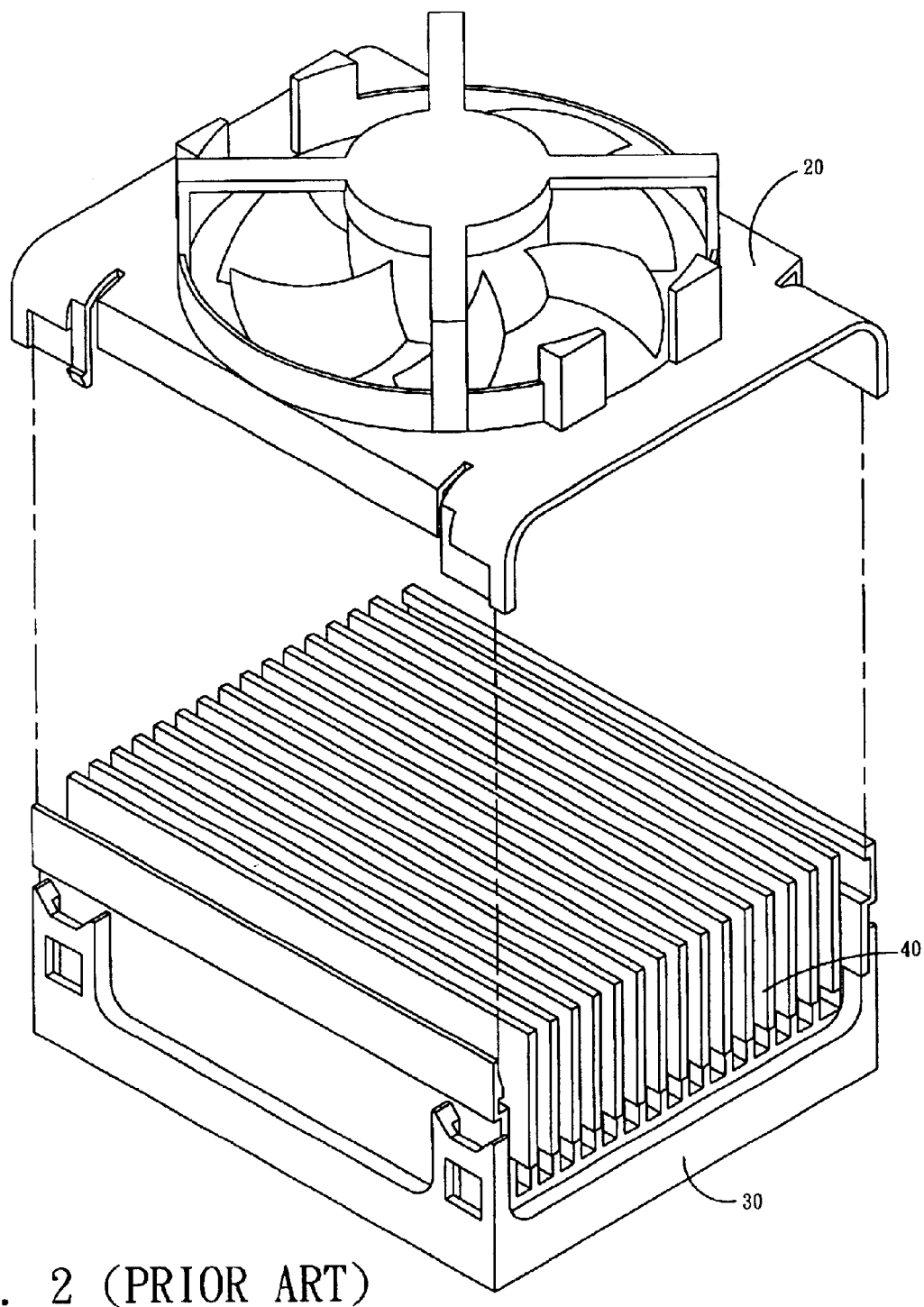
FIG. 2 is a perspective view of another conventional radiator fan.
Figure 3:
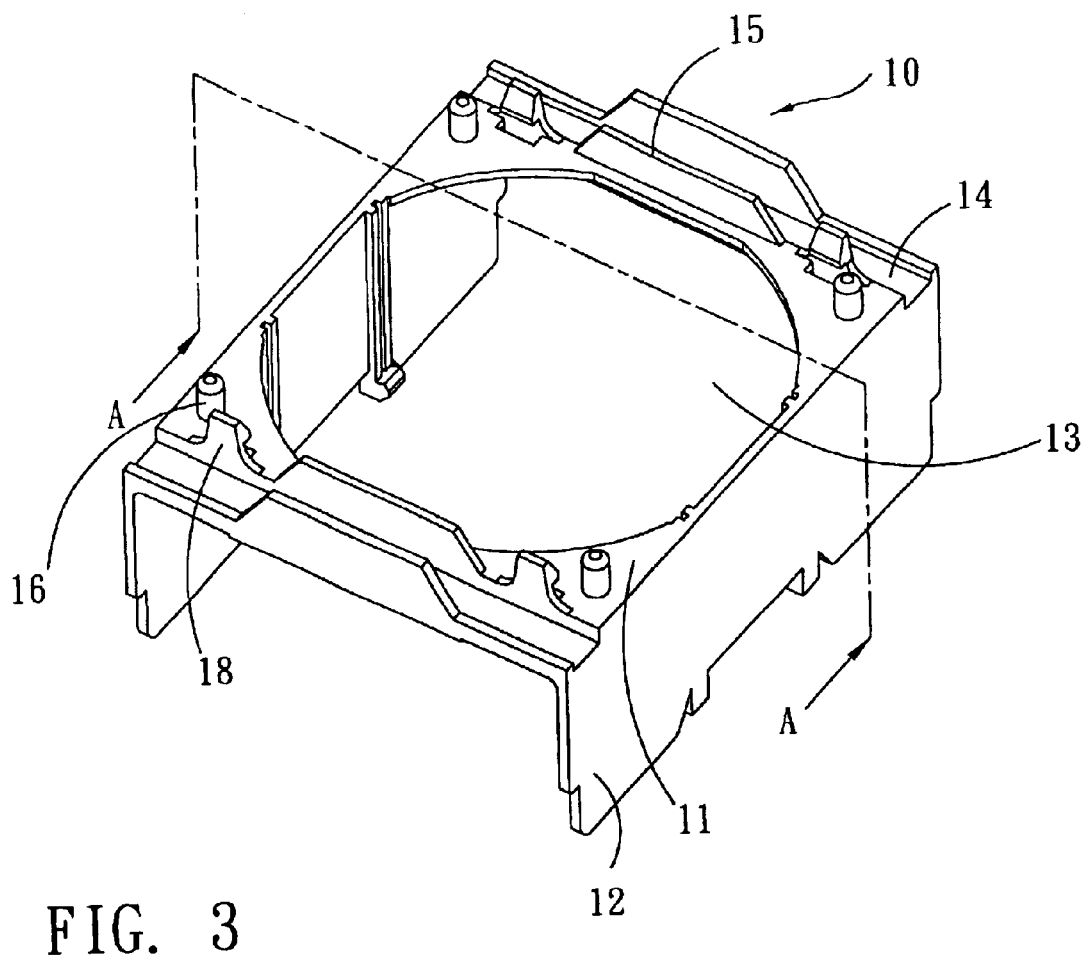
FIG. 3 is a perspective view of a support seat according to the present invention.
Figure 4:
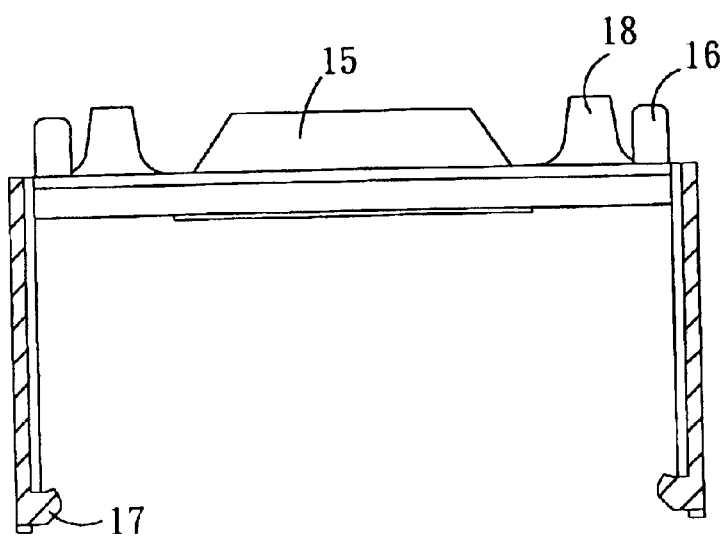
FIG. 4 is a sectional view along line 4—4 shown in FIG. 3.

Referring to FIGS. 3 and 4, a fan stand 10 according to the present invention basically is an inversed U shaped body with a horizontally flat portion 11 and two extending downward parallel side portions 12. The flat portion 11 at the middle thereof is provides with a circular hole 13 and at two opposite sides thereof has an elongated recess 14 respectively to extend along each of the two sides. The recess 14 at two opposite elongated edges thereof extends upward a baffle 15 respectively. The flat portion 11 further has multiple locating posts 16 situated by the recesses 14 and multiple inversed inward facing hooks 18 are disposed at the inner elongated edge of the respective recess 14 next to the baffle 15. Each of the side portions 12 at the bottom thereof has multiple hanging hooks 17 respectively.

Figure 5:
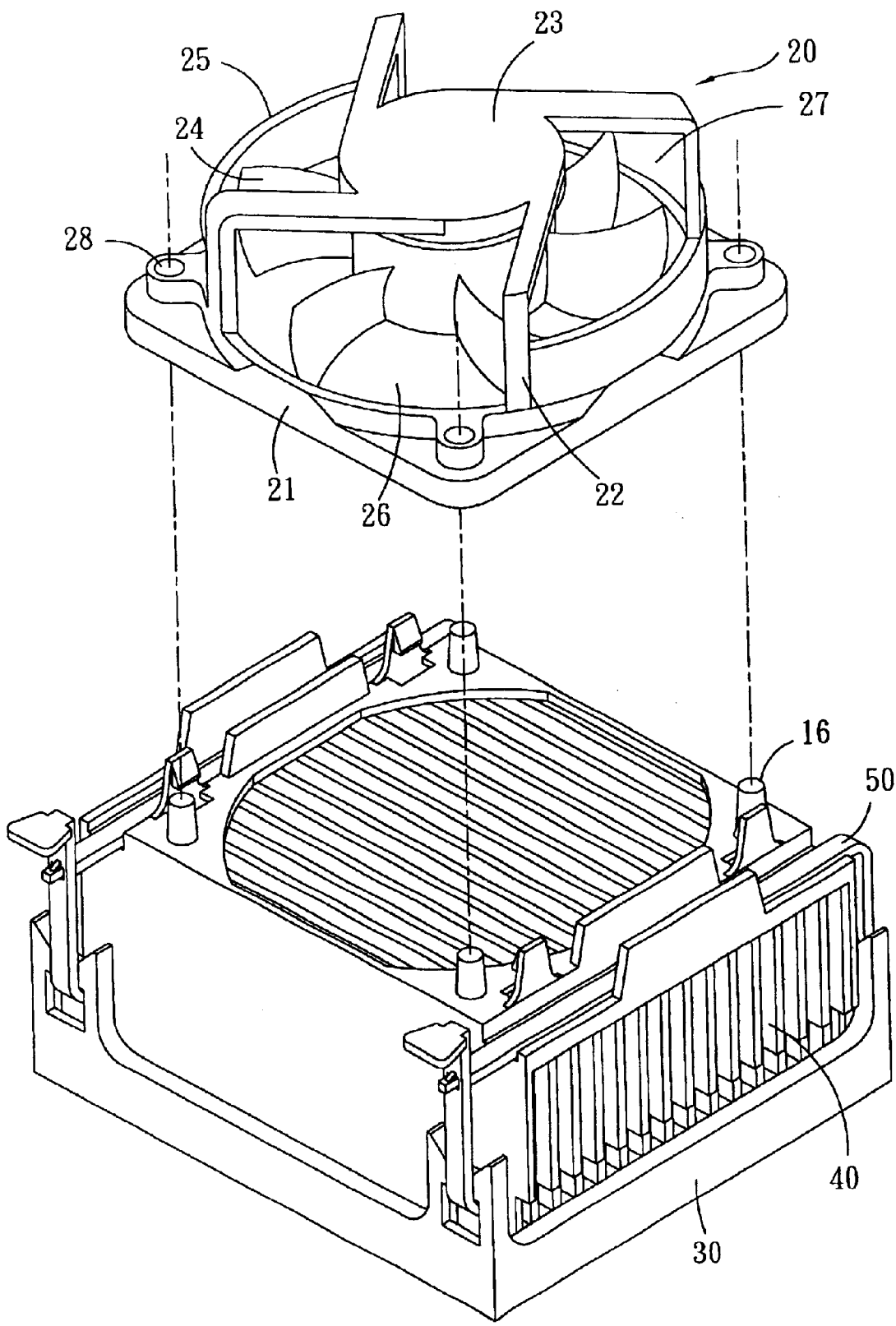
FIG. 5 is a perspective view of a radiator fan according to the present invention illustrating a radiator and a fan thereof in a state of being disassembled.

Next, referring to FIG. 5, a fan assembly 20 of the present invention has a hollow fixing plate 21 and multiple support frames 22 extend upward from the fixing plate 21 and are joined to a guard plate 23. A fan 24 is arranged inside the guard plate 23. A wind shielding plate 25 is disposed between and joined to two adjacent support frames 22 alternately on the fixing plate 21 so that air inlets 26 are constituted next to the wind shielding plates 25 alternately. Further, a respective opening 27 is formed between the guard plate 23 and each wind shielding plate 25. Besides, the fixing plate 21 at four corners thereof has a locating hole 28 respectively.

Figure 6:
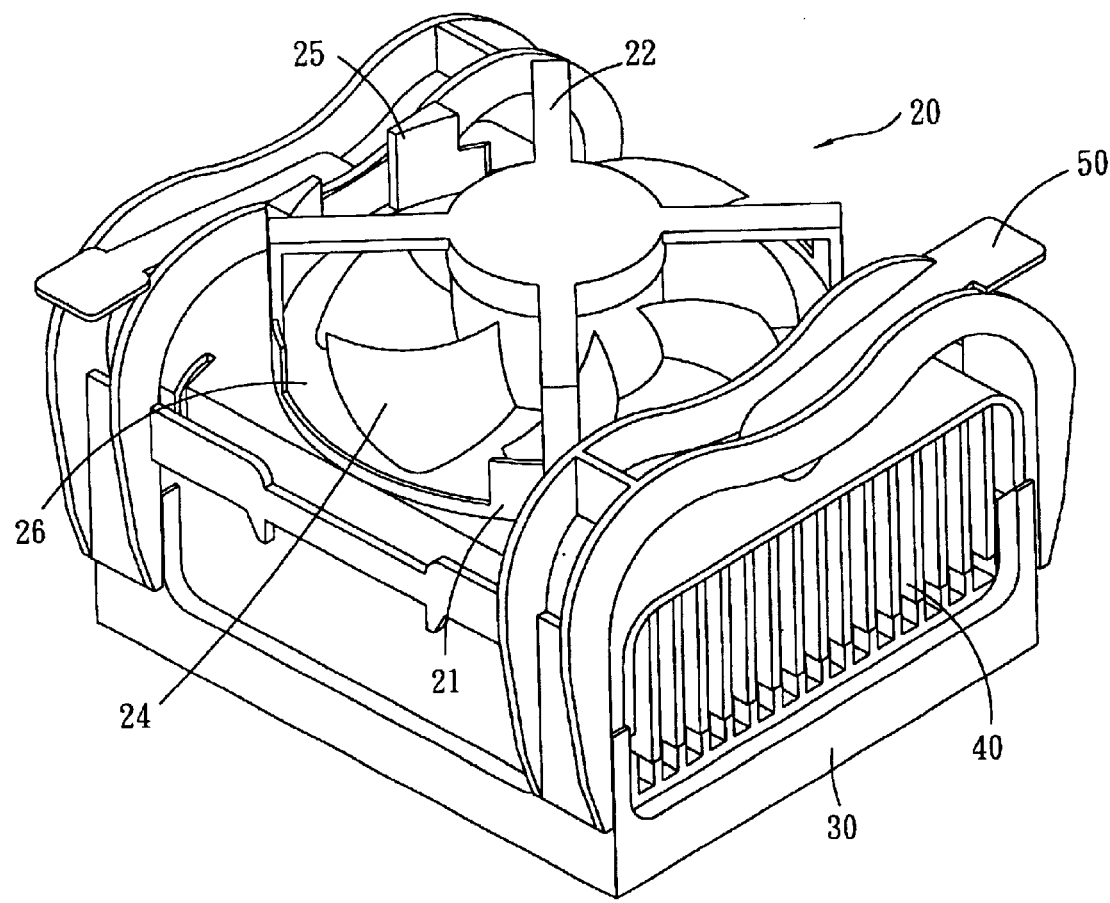
FIG. 6 is a perspective view of a radiator fan according to the present invention.

In practice, a base 30 fixedly attached to the main board receives the radiator 40 and the fan stand 10 is attached to the radiator 40 with hanging hooks 17 at the bottom of the respective side portion 12 of the fan stand 10 catch the radiator 40. Then, the two elongated recesses 14 at two opposite sides of the flat portion 11 accommodate a retaining device 50 respectively such that that the retaining device 50 can engage with the base 30 to secure the radiator 40 and the fan stand 10 to the base 30 with the aid of the baffles 15 at two lateral sides of the respective recess 14. Further, the locating holes 28 on the fan assembly 20 can be fitted to the locating posts 16 on the fan stand 10 and the inversed hooks 18 on the fan stand 10 can secure the fan assembly 20 to the fan stand 10 as shown in FIG. 6. It can be seen that the wind shielding plates 25 and the air inlets 26 are not blocked after the fan stand 10 and the fan assembly 20 being assembled together and the air inlets 26 are big enough to prevent generation of turbulence and loud noise. Besides, the height of the fan stand 10 with the fan assembly 20 is low after being joined together so that a pressure difference can be produced at the air inlets 26 to create preferable static pressure.

Figure 7:
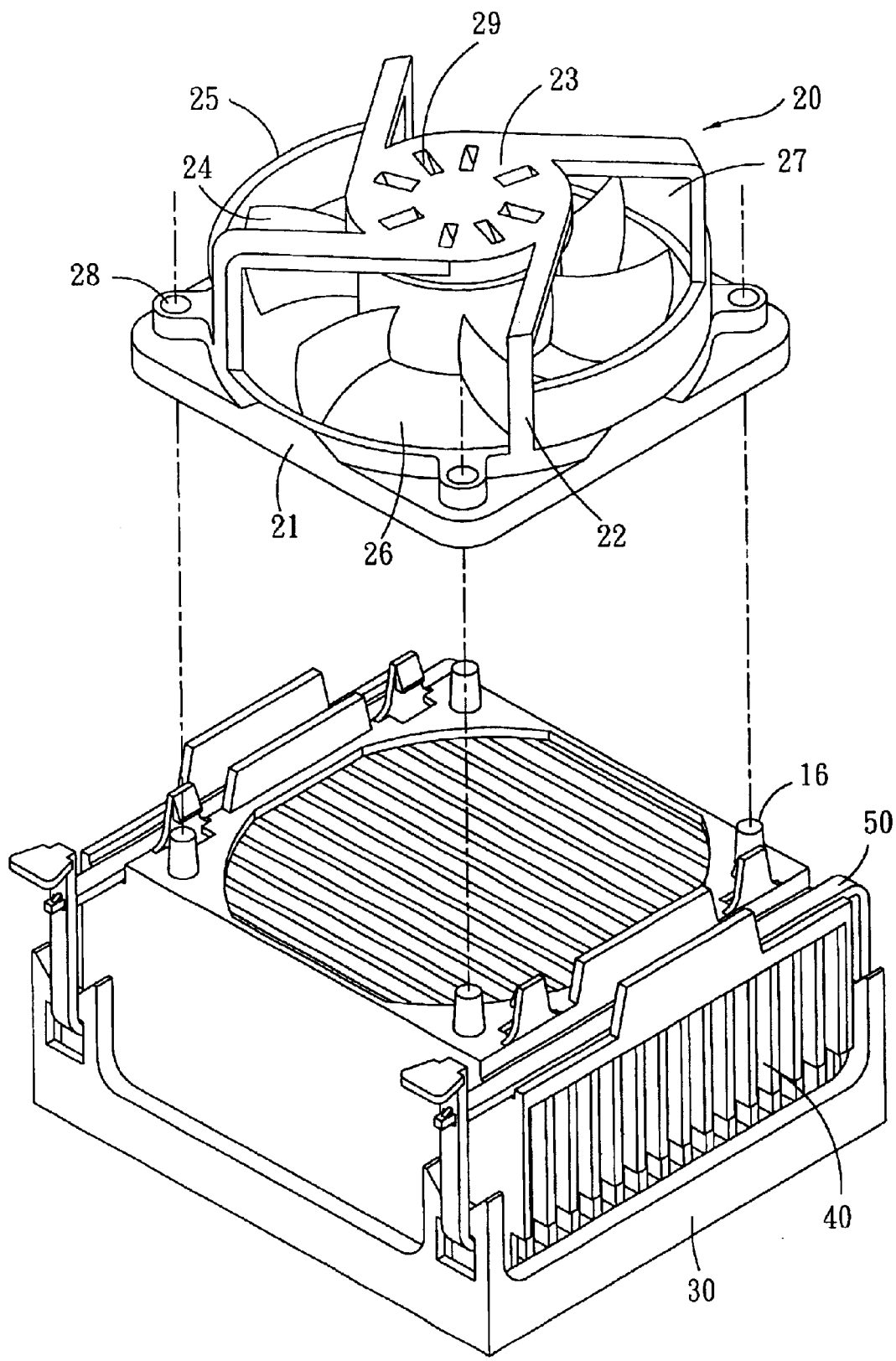
FIG. 7 is a perspective view of a radiator fan according to the present invention in another embodiment thereof illustrating a radiator and a fan thereof in a state of being disassembled.

Referring to FIG. 7, another embodiment of the present invention is illustrated. It can be seen that the guard plate 23, which is over the fan assembly 20 and directly on a fan 24, is provided with multiple elongated openings 29 so as to admit the airflow for dissipating the heat generated by the parts underneath during the fan 24 running.

While the invention has been described with reference to preferred embodiments thereof, it is to be understood that modifications or variations may be easily made without departing from the spirit of the invention, which is defined in appended claims.

What is claimed is:

1. A U-shaped fan stand comprising
   a horizontal portion, having a hollow part with an elongated recess disposed by two opposite sides and extending along the two opposite sides respectively, the elongated recess extending upward at two opposite lateral edges thereof to form a baffle respectively and a plurality of locating posts being provided beside the elongated re recess; and
   two opposite vertical side portion, being disposed next to the horizontal portion and each of the side portions having a plurality of hanging hooks at the bottom thereof.

2. The fan stand as defined in claim 1, wherein a plurality of inverted hooks are disposed at an inner one of the lateral edges of the elongated recess.

3. A radiator fan, comprising:
   a hollow fixing plate;
   a plurality of support frames, extending upward from the fixing plate;
   a guard plate, being disposed over the support frames and joined to the support frames respectively;
   a fan, being arranged under the guard plate;
   at least a wind shielding plate, being disposed between and joined to two adjacent ones of the support frames; and
   at least an air inlet, being disposed between another two adjacent ones of the support frames.

4. The radiator fan as defined in claim 3, wherein the wind shielding plate and the air inlet are disposed alternately.

5. The radiator fan as defined in claim 3, wherein a spacing is formed between the wind shielding plate and the guard plate.

* * * * *